United States Patent
Kim et al.

(10) Patent No.: US 8,519,760 B2
(45) Date of Patent: Aug. 27, 2013

(54) DEVICE CHARACTERISTIC COMPENSATION CIRCUIT AND SEMICONDUCTOR APPARATUS USING THE SAME

(75) Inventors: Ki Han Kim, Icheon-si (KR); Hyun Woo Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 117 days.

(21) Appl. No.: 13/219,611

(22) Filed: Aug. 27, 2011

(65) Prior Publication Data
US 2012/0194233 A1    Aug. 2, 2012

(30) Foreign Application Priority Data
Jan. 31, 2011   (KR) .................. 10-2011-0009798

(51) Int. Cl.
*H03L 7/06*   (2006.01)
(52) U.S. Cl.
USPC ........... 327/158; 327/149; 327/153; 327/161; 375/371; 375/375; 375/376
(58) Field of Classification Search
USPC ........................................ 327/147, 156, 158
See application file for complete search history.

(56) References Cited

U.S. PATENT DOCUMENTS
2011/0241742 A1* 10/2011 Kim et al. .................. 327/158
2012/0044002 A1* 2/2012 Kim et al. .................. 327/158

FOREIGN PATENT DOCUMENTS
KR     10-0353543 B1     9/2002

OTHER PUBLICATIONS

Saurabh Dighe, Within-Die Variation-Aware Dynamic-Voltage-Frequency Scaling Core Mapping and Thread Hopping for an 80-Core Processor, IEEE International Solid-State Circuits Conference, 2010.
Hyun-Woo Lee, A 1.6V 3.3Gb/s GDDR3 DRAM with Dual-Mode Phase and Delay-Locked Loop Using Power-Noise Management with Unregulated Power Supply in 54nm CMOS, IEEE International Solid-State Circuits Conference, 2009.
Won-Joo Yun, A 0.1-to1.5GHz 4.2mW All-Digital DLL with Dual Duty-Cycle Correction Circuit and Update Gear Circuit for DRAM in 66nm CMOS Technology, 2008.
Dong Uk Lee, A 2.5Gb/s/pin 256Mb GDDR3 SDRAM with Series Pipelined CAS Latency Control and Dual-Loop Digital DLL, 2006.

\* cited by examiner

*Primary Examiner* — John Poos
(74) *Attorney, Agent, or Firm* — William Park & Associates Patent Ltd.

(57) ABSTRACT

A device characteristic compensation circuit includes a device characteristic detection block configured to detect one or more of a frequency of a clock signal and characteristics of devices, and generate a control code signal according to a detection result; and an internal voltage regulation unit configured to regulate a level of an internal voltage in response to the control code signal and generate a corrected internal voltage.

22 Claims, 3 Drawing Sheets

DEVICE CHARACTERISTIC COMPENSATION CIRCUIT AND SEMICONDUCTOR APPARATUS USING THE SAME

CROSS-REFERENCES TO RELATED APPLICATION

The present application claims priority under 35 U.S.C. §119(a) to Korean application number 10-2011-0009798, filed on Jan. 31, 2011, in the Korean Intellectual Property Office, which is incorporated herein by reference in its entirety as set forth in full.

BACKGROUND

1. Technical Field

The present invention relates to a semiconductor apparatus, and more particularly, to a device characteristic compensation circuit and a semiconductor apparatus using the same.

2. Related Art

In general, a plurality of semiconductor chips, which are to be mounted on semiconductor apparatuses, are manufactured in a state in which they are arranged on a wafer. While the plurality of chips are manufactured on the same wafer, the performances of the plurality of chips may vary. That is to say, even though a chip positioned on the center portion of the wafer and a chip positioned on the peripheral portion of the wafer are manufactured through the same manufacturing procedure, these chips may undergo differences in processes. Thus, changes may occur in the characteristics of devices constituting the chips, and accordingly, changes may occur in the performances of the chips.

Semiconductor apparatuses are designed to use an internal voltage with a predetermined level regardless of the above-described differences in the characteristics of the devices and the performances of chips. Thus, the change in the characteristics of devices of a chip may be reflected on the performance of the semiconductor apparatus, and thus the performance of the semiconductor apparatus may deteriorate.

However, in a known semiconductor apparatus, the internal voltage with the predetermined level is used regardless of the frequency of the clock signal and the characteristics of the devices.

SUMMARY

A device characteristic compensation circuit which can is compensate for the performance of a chip depending upon a frequency of a clock signal, a process skew and device characteristics, and a semiconductor apparatus using the same are described herein.

In one embodiment of the present invention, a device characteristic compensation circuit includes: a device characteristic detection block configured to detect one or more of a frequency of a clock signal and characteristics of devices, and generate a control code signal according to a detection result; and an internal voltage regulation unit configured to regulate a level of an internal voltage in response to the control code signal and generate a corrected internal voltage.

In another embodiment of the present invention, a semiconductor apparatus includes: a delay locked loop configured to delay a clock signal; a clock buffering unit configured to buffer and output the delayed clock signal in response to a buffer control signal; a device characteristic detection block configured to detect one or more of a frequency of the clock signal and characteristics of devices, and generate a control code signal according to a detection result; and a buffer control unit configured to generate the buffer control signal from one of first and second operation signals in response to the control code signal.

In still another embodiment of the present invention, a semiconductor apparatus includes: a delay locked loop configured to delay a clock signal; a device characteristic detection block configured to detect one or more of a frequency of the clock signal and is characteristics of devices, and generate a control code signal according to a detection result; and an update cycle setting unit configured to change an update cycle of the delay locked loop in response to the control code signal.

BRIEF DESCRIPTION OF THE DRAWINGS

Features, aspects, and embodiments are described in conjunction with the attached drawings, in which.

DETAILED DESCRIPTION

Hereinafter, a device characteristic compensation circuit and a semiconductor apparatus using the same according to the present invention will be described below with reference to the accompanying is drawings through exemplary embodiments.

Figure 1:
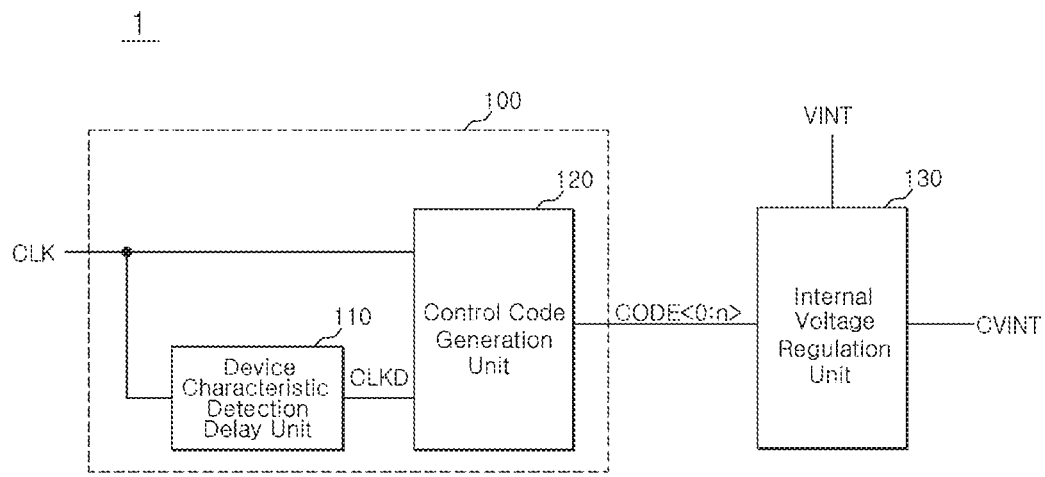
FIG. 1 is a block diagram schematically illustrating the configuration of a device characteristic compensation circuit in accordance with an embodiment of the present invention.

FIG. 1 is a block diagram schematically illustrating the configuration of a device characteristic compensation circuit in accordance with an embodiment of the present invention. In FIG. 1, a device characteristic compensation circuit 1 includes a device characteristic detection block 100 and an internal voltage regulation unit 130.

The device characteristic detection block 100 is configured to receive a clock signal CLK and generate a control code signal CODE<0:n>. The device characteristic detection block 100 may detect one or more of the frequency of the clock signal CLK and the characteristics of devices such as a skew, and generate the control code signal CODE<0:n> according to the detection result. The frequency of the clock signal CLK means a clock rate or clock speed, and the characteristics of devices mean, according to the exemplary embodiment, operation speed of the devices constituting the chip of a semiconductor apparatus. Therefore, in the embodiment of the present invention, fast/slow characteristics of devices may mean that the characteristics of devices are not equal to predetermined values, e.g., target values. Also, the fast/slow characteristics of devices may mean that skews are larger than predetermined values. The predetermined values may mean characteristics of the devices intended by a semiconductor manufacturer or designer. Here, the characteristics of devices may vary depending on the process of manufacture of the semiconductor chip. The device characteristic is detection block 100 may detect one or more of the frequency of the clock signal CLK and the characteristics of devices, and increase or decrease the code value of the control code signal CODE<0:n>.

The device characteristic detection block 100 includes a device characteristic detection delay unit 110 and a control code generation unit 120. The device characteristic detection delay unit 110 is configured to receive the clock signal CLK and generates a delayed clock signal CLKD. The device characteristic detection delay unit 110 may be identical to any of signal paths constituting the semiconductor apparatus, to detect the characteristics of devices. Otherwise, the device characteristic detection delay unit 110 may be configured to have substantially the same delay value as the delay value of any of the signal paths constituting the semiconductor apparatus. That is, the device characteristic detection delay unit 110 may be a replica delay line of the signal paths constituting the semiconductor apparatus. For example, the device characteristic detection delay unit 110 may be configured to be identical to a signal path with a worst condition or may have substantially the same delay value as the delay value of the signal path with the worst condition. Moreover, in order to obtain a rough detection result for the characteristics of devices, the device characteristic detection delay unit 110 may be configured to be identical to a portion of the signal path or may have substantially the same delay value as the delay value of the portion of the signal path. The signal path may be, for example, a data path from an input terminal to an output terminal of is the semiconductor apparatus. In other words, the signal path may be a longest signal path among the signal paths of the semiconductor apparatus, that is, a critical path. However, the present invention is not limited to such a signal path, and various signal paths such as an address path and command path may be used among the signal paths of the semiconductor apparatus.

In the case where a circuit identical to the critical path or a circuit having substantially the same delay value as the critical path is selected as the device characteristic detection delay unit 110, the clock signal CLK may be delayed to a worst condition by the device characteristic detection delay unit 110, and the control code signal CODE<0:n> is outputted as a corresponding value.

The control code generation unit 120 is configured to receive the clock signal CLK and the delayed clock signal CLKD and generate the control code signal CODE<0:n>. The control code generation unit 120 may increase or decrease the control code signal CODE<0:n> according to the frequency of the clock signal CLK and a detection result for the characteristics of devices. The configuration of the control code generation unit 120 will be described later in detail.

The internal voltage regulation unit 130 is configured to receive an internal voltage VINT and the control code signal CODE<0:n> and generate a corrected internal voltage CVINT. The internal voltage VINT is a voltage which is generated in an internal voltage generation circuit of the semiconductor apparatus by is regulating the level of an external voltage or a power supply voltage so that the external voltage or the power supply voltage may be used in the semiconductor apparatus. The internal voltage regulation unit 130 may regulate the level of the internal voltage VINT in response to the control code signal CODE<0:n> and generate the corrected internal voltage CVINT. For example, the internal voltage regulation unit 130 generates the corrected internal voltage CVINT with a relatively high level from the internal voltage VINT, e.g., a level higher than the internal voltage VINT, when the code value of the control code signal CODE<0:n> is larger than a reference value. Also, the internal voltage regulation unit 130 generates the corrected internal voltage CVINT with a relatively low level from the internal voltage VINT, e.g., a level lower than the internal voltage VINT, when the code value of the control code signal CODE<0:n> is smaller than the reference value. Further, when the code value of the control code signal CODE<0:n> has a value equal to the reference value, the internal voltage regulation unit 130 may provide the corrected internal voltage CVINT equal to the internal voltage VINT.

Figure 2:
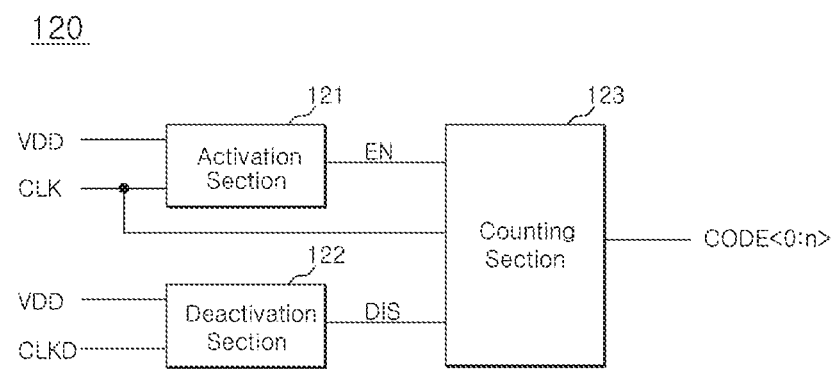
FIG. 2 is a block diagram schematically illustrating an exemplary embodiment of the control code generation unit shown in FIG. 1.

FIG. 2 is a block diagram schematically illustrating an exemplary embodiment of the control code generation unit shown in FIG. 1. In FIG. 2, the control code generation unit 120 includes an activation section 121, a deactivation section 122, and a counting section 123. The activation section 121 is configured to generate an enable signal EN when receiving the clock signal CLK. The activation section 121 may be constituted by a flip-flop and may generate the is enable signal EN of a pulse type from an external voltage VDD when the clock signal CLK is inputted. The deactivation section 122 is configured to generate a disable signal DIS when receiving the delayed clock signal CLKD. Similarly to the activation section 121, the deactivation section 122 may be constituted by a flip-flop and may generate the disable signal DIS of a pulse type when the delayed clock signal CLKD is inputted.

The counting section 123 is configured to count the toggling number of the clock signal CLK from a time when the enable signal EN is enabled to a time when the disable signal DIS is enabled. The counting section 123 counts the toggling number of the clock signal CLK from the time when the enable signal EN is enabled to the time when the disable signal DIS is enabled, and thus the value of the control code signal CODE<0:n> increases depending upon a duration of the enable signal EN, i.e., delay amount of the device characteristic detection delay unit 110. For example, in the case where the counted toggling number of the clock signal CLK is small, the counting section 123 generates the control code signal CODE<0:n> with a small code value, and in the case where the counted toggling number of the clock signal CLK is large, the counting section 123 generates the control code signal CODE<0:n> with a large code value.

Through the above-described configuration, the device characteristic detection block 100 the control code signal CODE<0:n> with code value increasing along with the frequency of the clock signal CLK and the delay amount of the device characteristic is detection delay unit 110. for example, the device characteristic detection block 100 generates the control code signal CODE<0:n> with a large code value if the frequency of the clock signal CLK is high or the delay amount of the device characteristic detection delay unit 110 is large. Conversely, the device characteristic detection block 100 may generate the control code signal CODE<0:n> with a small code value if the frequency of the clock signal CLK is low or the delay amount of the device characteristic detection delay unit 110 is small. Accordingly, in the case where the frequency of the clock signal CLK has a constant value, the device characteristic detection block 100 may generate the control code signal CODE<0:n> with a code value smaller than a reference value when the characteristics of devices are faster than a reference, may generate the control code signal CODE<0:n> with a code value larger than the reference value when the characteristics of devices are slower than the reference, and may generate the control code signal CODE<0:n> with a code value equal to the reference value when the characteristics of devices are equal to the reference.

Figure 3:
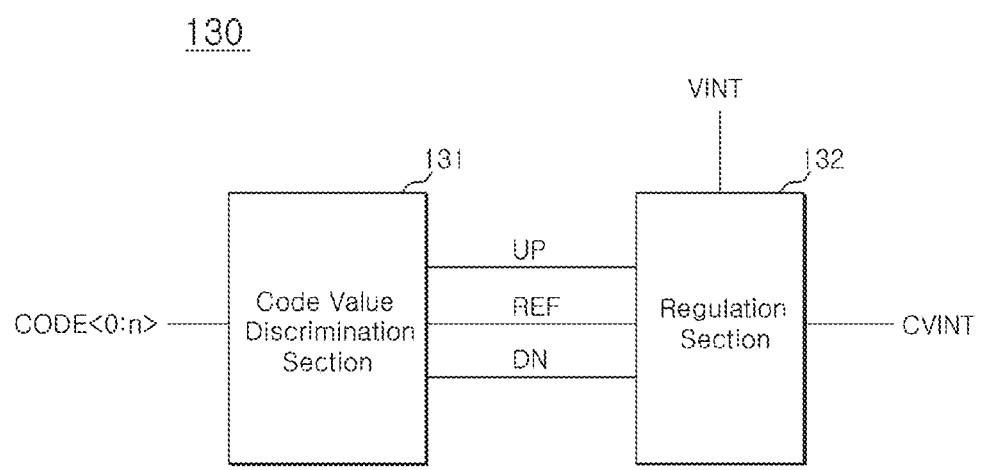
FIG. 3 is a block diagram schematically illustrating an exemplary embodiment of the internal voltage regulation unit shown in FIG. 1.

FIG. 3 is a block diagram schematically illustrating an exemplary embodiment of the internal voltage regulation unit shown in FIG. 1. The internal voltage regulation unit 130 includes a code value discrimination section 131 and a regulation section 132. The code value discrimination section 131 is configured to receive the control code signal CODE<0:n> and generate code value discrimination signals. The code value discrimination signals include is an up signal UP, a down signal DN and a reference signal REF. The code value discrimination section 131 generates the up signal UP, the down signal DN and the reference signal REF depending upon the code value of the control code signal CODE<0:n>. That is to say, the code value discrimination section 131 sets a reference value when the characteristics of devices are the same as a designed characteristics. If the control code signal CODE<0:n> with a value larger than the reference value is inputted, the code value discrimination section 131 generates the up signal UP. If the control code signal CODE<0:n> with the same value as the reference value is inputted, the code value discrimination section 131 generates the reference signal REF. If the control code signal CODE<0:n> with a value smaller than the reference value is inputted, the code value discrimination section 131 generates the down signal DN. The code value discrimination section 131 may be realized using a decoder circuit which is generally known in the art.

The regulation section 132 is configured to regulate the level of the internal voltage VINT depending upon the code value discrimination signal and generate the corrected internal voltage CVINT. The regulation section 132 provides a voltage with a level higher than the internal voltage VINT as the corrected internal voltage CVINT when the up signal UP is received from the code value discrimination section 131. The regulation section 132 provides the internal voltage VINT as the corrected internal voltage CVINT when the reference signal REF is received from the code value discrimination section 131. Further, the regulation section 132 provides a voltage with a level lower than the internal voltage VINT as the corrected internal voltage CVINT when the down signal DN is received from the code value discrimination section 131. The corrected internal voltage CVINT is transmitted to internal circuits in the semiconductor apparatus and is used as power of the internal circuits.

The operations of the device characteristic compensation circuit 1 in accordance with the embodiment of the present invention will be described below with reference to FIGS. 1 to 3. In the case of a semiconductor apparatus including a chip with the characteristics of devices that are fast, the device characteristic detection delay unit 110 has a small delay amount. In the case of a semiconductor apparatus including a chip with the characteristics of devices that are slow, the device characteristic detection delay unit 110 has a large delay amount. In the case of a semiconductor apparatus including a chip with the characteristics of devices that are the same as designed characteristics, the device characteristic detection delay unit 110 has a delay amount between the delay amounts in the cases of the characteristics of devices that are fast and slow. Here, when assuming that the frequency of the inputted clock signal CLK has a constant value, the toggling number of the clock signal CLK, from the time when the enable signal EN is enabled in response to the clock signal CLK to the time when the disable signal DIS is enabled in response to the delayed clock signal CLKD delayed by the device is characteristic detection delay unit 110, has the largest value when the devices have the slowest characteristics of devices. Also, the toggling number has the smallest value when the devices have the fastest characteristics of devices. Further, the toggling number has, for example, the reference value (e.g., an intermediate value) when the devices have moderate characteristics of devices. For the sake of convenience, it will be assumed that the control code generation unit 120 has only above three cases. When the devices have the slowest characteristics of devices, the control code generation unit 120 generates the control code signal CODE<0:n> with a largest code value, and the code value discrimination section 131 outputs the up signal UP, and thus the internal voltage regulation unit 130 generates the corrected internal voltage CVINT with a level higher than the internal voltage VINT. When the devices have the moderate characteristics of devices, the control code generation unit 120 generates the control code signal CODE<0:n> corresponding to the reference value, and the code value discrimination section 131 outputs the reference signal REF, and thus the internal voltage regulation unit 130 generates the corrected internal voltage CVINT without adjusting the internal voltage VINT. When the devices have the fastest characteristics of devices, the control code generation unit 120 generates the control code signal CODE<0:n> with a code value smaller than those of the above two cases, and the code value discrimination section 131 outputs the down signal DN, and thus the internal voltage regulation unit 130 generates the corrected internal voltage CVINT with a level lower than the internal voltage VINT. Accordingly, the device characteristic compensation circuit 1 in accordance with the embodiment of the present invention improves an operation speed by providing an internal voltage with a high level when the characteristics of devices are slow, and optimizes an operation speed by providing an internal voltage with a low level when the characteristics of devices are fast. Therefore, in the embodiment of the present invention, the performance of a chip may be optimized according to the characteristics of devices, and the reliability of the chip may be improved.

Further, in the case where the semiconductor apparatus receives the clock signal CLK with a high frequency, the code value of the control code signal CODE<0:n>, which is generated by the control code generation unit 120, further increases in each of the above cases, and thus, the level of the corrected internal voltage CVINT, which is provided by the internal voltage regulation unit 130, may further increase. Conversely, in the case where the semiconductor apparatus receives the clock signal CLK with a low frequency, the code value of the control code signal CODE<0:n>, which is generated by the control code generation unit 120, further decreases in each of the above cases, and thus, the level of the corrected internal voltage CVINT, which is provided by the internal voltage regulation unit 130, may further decrease. Accordingly, in the embodiment of the present invention, in a semiconductor apparatus which receives the clock signal CLK with the high frequency, the corrected internal voltage CVINT with a high level may be generated so that the semiconductor apparatus may operate with a high performance, and in a semiconductor apparatus which receives the clock signal CLK with the low frequency, the corrected internal voltage VINT with a low level may be generated so that unnecessary current consumption may be reduced.

As a consequence, the device characteristic compensation circuit 1 in accordance with the embodiment of the present invention may provide the corrected internal voltage CVINT with a high level as the frequency of the clock signal is high and the characteristics of devices are slow. Further, the device characteristic compensation circuit 1 in accordance with the embodiment of the present invention may provide the corrected internal voltage CVINT with a low level as the frequency of the clock signal is low and the characteristics of devices are fast.

Figure 4:
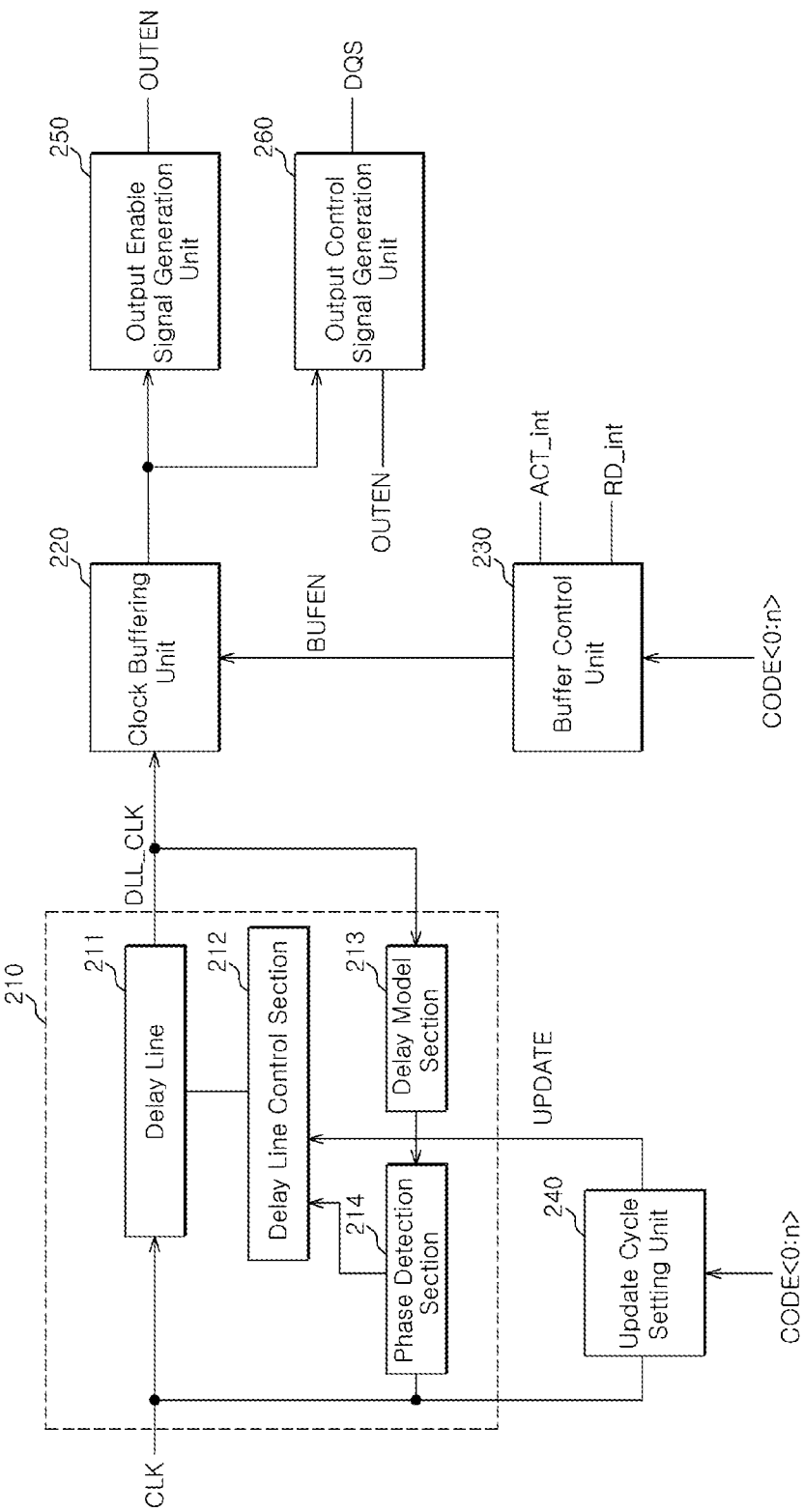
FIG. 4 is a block diagram schematically illustrating the configuration of a semiconductor apparatus in accordance with another embodiment of the present invention.

FIG. 4 is a block diagram schematically illustrating the configuration of a semiconductor apparatus in accordance with another embodiment of the present invention. In FIG. 4, the semiconductor apparatus 2 includes a delay locked loop 210, a clock buffering unit 220, a buffer control unit 230, and an update cycle setting unit 240. The delay locked loop 210 is configured to receive a clock signal CLK, delay the clock signal CLK by a predetermined time, and generate a delayed clock signal DLL_CLK. The delay locked loop 210 includes a delay line 211, a delay line control section 212, a delay model section 213, and a phase detection section 214.

The clock buffering unit 220 buffers and outputs the internal clock signal DLL_CLK in response to a buffer enable signal BUFEN. By including the delay locked loop 210 and the clock buffering unit 220, the semiconductor apparatus 2 is configured to internally operate in response to a command inputted in synchronization with the clock signal CLK.

The buffer control unit 230 receives the control code signal CODE<0:n> which is generated from the device characteristic detection block 100 shown in FIG. 1. The buffer control unit 230 is configured to generate the buffer enable signal BUFEN from one of a first operation signal ACT_int and a second operation signal RD_int in response to the control code signal CODE<0:n>. The buffer control unit 230 provides one of the first and second operation signals ACT_int and RD_int as the buffer enable signal BUFEN in response to the control code signal CODE<0:n>. In the present embodiment of the invention, the enable period of the second operation signal RD_int may be shorter than the enable period of the first operation signal ACT_int. For example, the first operation signal ACT_int may be an active signal, and the second operation signal RD_int may be a read signal. Here, the active signal is a signal which activates the semiconductor apparatus 2, and the read signal is a signal which commands an individual read operation to be performed after the semiconductor apparatus 2 is activated.

The buffer control unit 230 generates the buffer enable signal BUFEN from the first operation signal ACT_int when the code is value of the control code signal CODE<0:n> is larger than a predetermined value, and generates the buffer enable signal BUFEN from the second operation signal RD_int when the code value of the control code signal CODE<0:n> is smaller than the predetermined value. The buffer control unit 230 generates the buffer enable signal BUFEN from the first operation signal ACT_int with a long enable period when the code value of the control code signal CODE<0:n> is large, and generates the buffer enable signal BUFEN from the second operation signal RD_int with a short enable period when the code value of the control code signal CODE<0:n> is small.

In FIG. 4, the semiconductor apparatus 2 further includes an output enable signal generation unit 250 and an output control signal generation unit 260. The output enable signal generation unit 250 is configured to generate an output enable signal OUTEN by synchronizing the buffered internal clock signal DLL_CLK outputted from the clock buffering unit 220 with the clock signal CLK. The output control signal generation unit 260 is configured to receive the output enable signal OUTEN and the internal clock signal DLL_CLK and generate a data output control signal DQS. The data output control signal DQS is a signal which is synchronized with data outputted from the semiconductor apparatus 2 to an outside.

In the case where the frequency of the clock signal CLK is high or the characteristics of devices are slow, when the clock buffering unit 220 provides the internal clock signal DLL_CLK for a sufficient time, the output enable signal OUTEN may be normally generated. Therefore, in the present embodiment of the invention, in order for the normal generation of the output enable signal OUTEN, when the frequency of the clock signal CLK is high and the characteristics of devices are slow, the internal clock signal DLL_CLK may be provided for a sufficient time in response to the first operation signal ACT_int. Conversely, when the frequency of the clock signal CLK is low and the characteristics of devices are fast, a timing margin for generating the output enable signal OUTEN is sufficiently secured. Therefore, in the present embodiment of the invention, the internal clock signal DLL_CLK may be provided for a required time in response to the second operation signal RD_int. Hence, unnecessary current consumption may be reduced. As a consequence, in the present embodiment of the invention, as the device characteristic detection block 100 for detecting one or more of the frequency of the clock signal CLK and the characteristics of devices is provided, the generation period of the internal clock signal DLL_CLK, that is, the operation period of a DLL circuit may be set in conformity with an operating situation of the semiconductor apparatus 2.

The update cycle setting unit 240 may set the cycle of a delay locking operation of the delay locked loop 210. That is to say, the update cycle setting unit 240 is configured to provide an update signal UPDATE to the delay locked loop 210 and control the operation of the delay locked loop 210. When receiving the update signal UPDATE, the delay locked loop 210 changes the delay amount of the delay line 211 and performs the delay locking operation. The update cycle setting unit 240 changes the generating cycle of the update signal UPDATE in response to the control code signal CODE<0:n>.

The update cycle setting unit 240 shortens the generating cycle of the update signal UPDATE when the cycle of the clock signal CLK is short and the characteristics of devices are slow, and lengthens the generating cycle of the update signal UPDATE when the cycle of the clock signal CLK is long and the characteristics of devices are fast. Since the delay locked loop 210 performs the delay locking operation in response to the update signal UPDATE, the update cycle setting unit 240 generates the update signal UPDATE relatively more frequently when the cycle of the clock signal CLK is short and the characteristics of devices are slow, and decreases the number of times of generating the update signal UPDATE when the cycle of the clock signal CLK is long and the characteristics of devices are fast. Accordingly, the update cycle setting unit 240 controls the delay locking operation of the delay locked loop 210 in such a manner that the precise delayed clock signal DLL_CLK may be generated and unnecessary current consumption may be reduced.

While certain embodiments have been described above, it will be understood to those skilled in the art that the embodiments described are by way of example only. Accordingly, the device characteristic compensation circuit and the semiconductor apparatus using the same described herein should not be limited based on the described embodiments. Rather, the device characteristic is compensation circuit and the semiconductor apparatus using the same described herein should only be limited in light of the claims that follow when taken in conjunction with the above description and accompanying drawings.

What is claimed is:

1. A device characteristic compensation circuit comprising:
    a device characteristic detection block configured to detect one or more of a frequency of a clock signal and characteristics of devices, and generate a control code signal according to a detection result; and
    an internal voltage regulation unit configured to regulate a level of an internal voltage in response to the control code signal and generate a corrected internal voltage.
2. The device characteristic compensation circuit according to claim 1, wherein the device characteristic detection block comprises:

is a device characteristic detection delay unit configured to delay the clock signal and generate a delayed clock signal; and a control code generation unit configured to receive the clock signal and the delayed clock signal, and generate the control code signal.

3. The device characteristic compensation circuit according to claim 2, wherein the device characteristic detection delay unit generates the delayed clock signal by delaying the clock signal through a circuit which is identical to at least a portion of a signal path from an input terminal to an output terminal of a semiconductor apparatus.

4. The device characteristic compensation circuit according to claim 2, wherein the device characteristic detection delay unit generates the delayed clock signal by delaying the clock signal through a circuit which has substantially the same delay value as at least a portion of a signal path from an input terminal to an output terminal of a semiconductor apparatus.

5. The device characteristic compensation circuit according to claim 2, wherein the control code generation unit comprises:
an activation section configured to generate an enable signal in response to the clock signal;
a deactivation section configured to generate a disable signal in response to the delayed clock signal; and
a counting section configured to count the toggling number of the clock signal from a time when the enable signal is activated to a time when the disable signal is activated, and generate the control code signal.

6. The device characteristic compensation circuit according to claim 1, wherein the internal voltage regulation unit comprises:
a code value discrimination section configured to generate a code value discrimination signal in response to the control code signal; and
a regulation section configured to regulate the level of the internal voltage in response to the code value discrimination signal and generate the corrected internal voltage.

7. The device characteristic compensation circuit according to claim 1, wherein the device characteristic compensation circuit generates the corrected internal voltage with a level that increases as the frequency of the clock signal increases or the characteristics of devices become slow.

8. The device characteristic compensation circuit according to claim 1, wherein the device characteristic compensation circuit generates the corrected internal voltage with a level that decreases as the frequency of the clock signal decreases or the characteristics is of devices become fast.

9. A semiconductor apparatus comprising:
a delay locked loop configured to delay a clock signal;
a clock buffering unit configured to buffer and output the delayed clock signal in response to a buffer control signal;
a device characteristic detection block configured to detect one or more of a frequency of the clock signal and characteristics of devices, and generate a control code signal according to a detection result; and
a buffer control unit configured to generate the buffer control signal from one of first and second operation signals in response to the control code signal.

10. The semiconductor apparatus according to claim 9, wherein the device characteristic detection block comprises:
a device characteristic detection delay unit configured to delay the clock signal and generate a delayed clock signal; and a control code generation unit configured to receive the clock signal and the delayed clock signal, and generate the control code to signal.

11. The semiconductor apparatus according to claim 10, wherein the device characteristic detection delay unit generates the delayed clock signal by delaying the clock signal through a circuit which is identical to at least a portion of a signal path from an input terminal to an output terminal of a semiconductor apparatus.

12. The semiconductor apparatus according to claim 10, wherein the device characteristic detection delay unit generates the delayed clock signal by delaying the clock signal through a circuit which has substantially the same delay value as at least a portion of a signal path from an input terminal to an output terminal of a semiconductor apparatus.

13. The semiconductor apparatus according to claim 10, wherein the control code generation unit comprises:
an activation section configured to generate an enable signal in response to the clock signal;
a deactivation section configured to generate a disable signal in response to the delayed clock signal; and
a counting section configured to count the toggling number of the clock signal from a time when the enable signal is activated to a time when the disable signal is activated, and generate the control code signal.

14. The semiconductor apparatus according to claim 10, wherein an enable period of the second operation signal is shorter than an enable period of the first operation signal.

15. The semiconductor apparatus according to claim 14, wherein the first operation signal is an active signal, and the second operation signal is a read signal.

16. A semiconductor apparatus comprising:
a delay locked loop configured to delay a clock signal;
a device characteristic detection block configured to detect one or more of a frequency of the clock signal and characteristics of devices, and generate a control code signal according to a detection result; and
an update cycle setting unit configured to change an update cycle of the delay locked loop in response to the control code signal.

17. The semiconductor apparatus according to claim 16, wherein the device characteristic detection block comprises:
a device characteristic detection delay unit configured to delay the clock signal and generate a delayed clock signal; and
a control code generation unit configured to receive the clock signal and the delayed clock signal, and generate the control code signal.

18. The semiconductor apparatus according to claim 17, wherein the device characteristic detection delay unit generates the delayed clock signal by delaying the clock signal through a circuit which is identical to at least a portion of a signal path from an input is terminal to an output terminal of a semiconductor apparatus.

19. The semiconductor apparatus according to claim 17, wherein the device characteristic detection delay unit generates the delayed clock signal by delaying the clock signal through a circuit which has substantially the same delay value as at least a portion of a signal path from an input terminal to an output terminal of a semiconductor apparatus.

20. The semiconductor apparatus according to claim 17, wherein the control code generation unit comprises:
an activation section configured to generate an enable signal in response to the clock signal;
a deactivation section configured to generate a disable signal in response to the delayed clock signal; and a counting section configured to count the toggling number of the clock signal from a time when the enable signal is activated to a time when the disable signal is activated, and generate the control code signal.

21. The semiconductor apparatus according to claim 16, wherein the semiconductor apparatus sets the update cycle that is shortened as the frequency of the clock signal is high and the characteristics of devices are slow.

22. The semiconductor apparatus according to claim 16, wherein the semiconductor apparatus sets the update cycle that is lengthened as the frequency of the clock signal is low and the characteristics of devices are fast.

* * * * *